310-335
8/26/86 OR 4,608,507 SR

United States Patent [19]

Neubauer et al.

[11] Patent Number: 4,608,507

[45] Date of Patent: Aug. 26, 1986

[54] DAMPING DEVICE FOR FOCUSED PIEZOELECTRIC TRANSDUCER

[75] Inventors: Werner G. Neubauer, Annandale, Va.; Jon J. Mingo, Providence, R.I.

[73] Assignee: Micro Pure Systems, Inc., Warwick, R.I.

[21] Appl. No.: 626,452

[22] Filed: Jun. 29, 1984

[51] Int. Cl.[4] ..................... H01L 41/08

[52] U.S. Cl. ..................... 310/335; 73/642; 310/326

[58] Field of Search ..................... 310/335, 326; 73/703, 73/753, 754, 290 V, 632, 642, 644

[56] References Cited

U.S. PATENT DOCUMENTS

| | | | |
|---|---|---|---|
| 4,011,473 | 3/1977 | Massa | 310/355 |
| 4,044,273 | 8/1977 | Kanda et al. | 310/335 X |
| 4,112,773 | 9/1978 | Abts | 73/642 |
| 4,214,484 | 7/1980 | Abts | 73/632 |
| 4,316,115 | 2/1982 | Wilson et al. | 310/327 |
| 4,321,696 | 3/1982 | Kanda | 310/335 X |
| 4,365,515 | 12/1982 | Abts | 310/335 X |
| 4,455,873 | 6/1984 | Abts | 73/632 X |

FOREIGN PATENT DOCUMENTS

| | | | |
|---|---|---|---|
| 198797 | 6/1967 | U.S.S.R. | 310/327 |
| 248304 | 7/1969 | U.S.S.R. | 310/327 |

*Primary Examiner*—Mark O. Budd

[57] ABSTRACT

An ultrasonic detection apparatus having a transducer, a lens, and a damping ring, the damping ring being made of a material which is impedance-matched to the lens but which has a lower speed of sound so that stray noise in the lens travels into the damping ring and dissipates rather than remaining in the lens and reflecting back to the transducer as noise.

5 Claims, 4 Drawing Figures

DAMPING DEVICE FOR FOCUSED PIEZOELECTRIC TRANSDUCER

FIELD OF THE INVENTION

This invention relates to an apparatus for reducing noise in ultrasonic detection systems.

BACKGROUND OF THE INVENTION

Ultrasonic detection systems often include a transducer for generating acoustic signals and a lens which concentrates the signals in a focal region. Such a system is disclosed in Abts U.S. Pat. No. 4,365,515, which is incorporated herein by reference.

When these systems are used to detect very small particulates in fluids passing through the focal region, the noise which reaches the transducer must be kept very low. For example, when a small particulate enters the focal region, it is struck by the ultrasonic signal from the transducer, and the particulate reflects a very small amount of this energy back to the transducer. The transducer detects the small reflection and thus detects the presence of the particulate. Any noise or other interference which reaches the transducer about the same time as a reflection can mask the reflection so that the particulates goes undetected. Damping means for reducing such noise are described in Abts U.S. Pat. No. 4,112,773 and Abts U.S Pat. No. 4,214,484.

SUMMARY OF THE INVENTION

We have discovered that an ultrasonic detection system with reduced noise can be made by placing a damping ring around a lens associated with an ultrasonic transducer, the damping ring receiving and partially absorbing any signals from the transducer which would otherwise reflect internally in the lens and return to the transducer as noise.

In the preferred embodiment, a polymethyl methacrylate lens is associated with a transducer, and a damping ring surrounds the outside of the lens. A portion of the damping ring is cut away from the lens to allow the fluid into which the lens is placed to flow between the sides of the lens and the damping ring. The damping ring is made of Teflon ®, the speed of sound in which is less than the speed of sound in the lens material. In use, the acoustic energy which remains in the lens instead of going into the fluid travels out of the side of the lens into the fluid and into the damping ring. This noise is attenuated inside the damping ring and does not return to the transducer to mask the reflected signals from particulates in the focal region.

In another preferred embodiment, there is no opening between the damping ring and the side of the lens.

PREFERRED EMBODIMENTS

We now turn to the structure and operation of the preferred embodiments, after first briefly describing the drawings.

Drawings

Structure

Figure 1:
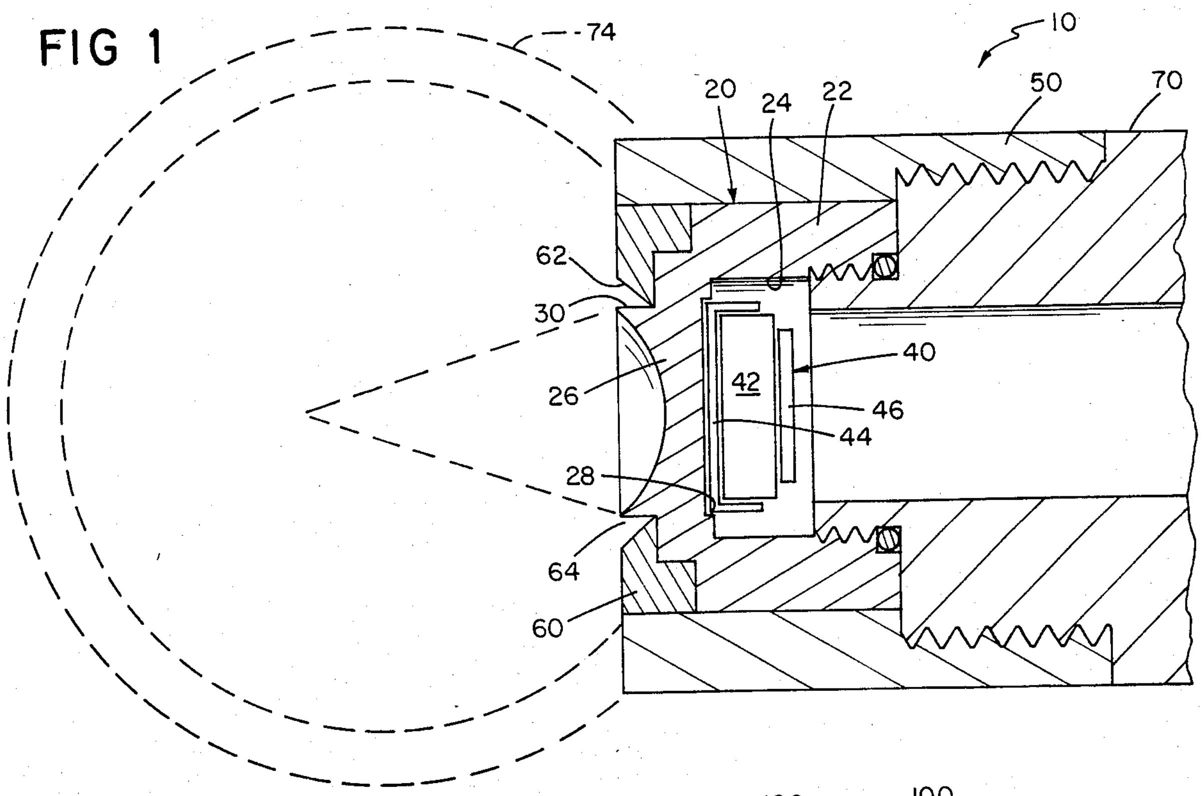
FIG. 1 is a cross-sectional view of an ultrasonic detection system of this invention.

Referring to FIG. 1, there is shown an ultrasonic detection apparatus 10. The apparatus 10, which is mounted on the end of a hollow cylinder 70, generally comprises a lens unit 20, a transducer 40, a protective sheath 50 and a damping ring 60.

The lens unit 20 has a cylindrical rear wall 22 surrounding a transducer cavity 24. A concave lens 26, having a transducer surface 28 which forms the floor of the transducer cavity 24, is disposed opposite the wall 22. The lens 26 has an outer wall 30, and the entire lens unit 20 is made of polymethyl methacrylate.

The transducer 40 comprises a cylindrical piezoelectric crystal 42 having a pair of electrodes 44, 46. The crystal of the preferred embodiment is a 10 MHz lithium-niobate circular crystal from the Valpey-Fisher Company of Hopkington, Mass., although other crystals could be used. The electrodes 44, 46 are connected to wires (not shown) which in turn are connected to a pulsing unit (also not shown), which is used to excite the crystal 42. A suitable pulsing unit is an MPH 1150 from Micro Pure Systems, Inc., the assignee of this application. The transducer 40 is secured to the transducer surface 28 of the lens unit 20 by a conductive epoxy such as Stycyst 1970.

The protective sheath 50 is cylindrical and it surrounds the lens unit 20. The lens unit 20 is held in place in the sheath 50 by a force fit, although other attachment means, e.g., screw threads, would also be suitable. The sheath 50 is screw-threaded to the end of the hollow cylinder 70.

The damping ring 60 surrounds the outer wall 30 of the lens 26. The ring 60, which is generally circular, has an inner face 62 cut away at an angle of 45° so that the face 62 and the lens wall 30 form a small opening 64 therebetween. The ring 60 is held in place on the lens unit 20 by a force fit and is made of Teflon ®.

The hollow cylinder 70 has an internal bore 72 for carrying the wires (not shown) to the transducer 40. The cylinder 70 may be arranged in the form of a hand-held probe, as in Abts U.S. Pat. No. 4,455,873, or it may terminate in a plug assembly (not shown) which is designed to be supported by a standard fitting giving access to the inside of a pipe containing a flow to be ultrasonically sensed. A Cosasco 2" hollow plug assembly is such a device.

Operation

In operation, the apparatus 10 is positioned so that the end of the lens unit 20 is just inside a pipe 74 containing the flow which is to be ultrasonically sensed, as shown in FIG. 1. The general operation of the transducer is as indicated in Abts U.S. Pat. No. 4,381,674, which is incorporated herein by reference, with ultrasonic pulses being periodically sent into the flow.

Figure 2:
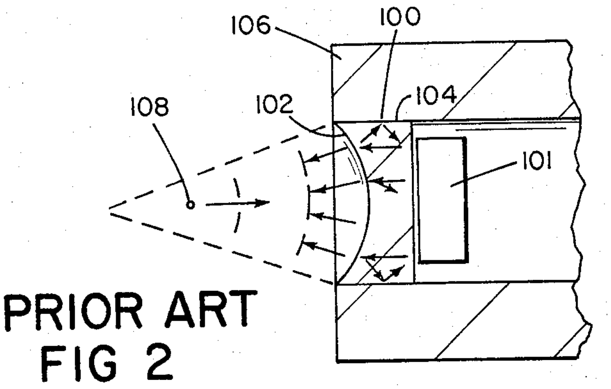
PRIOR ART FIG 2
FIG. 2 is a cross-sectional view of a prior art ultrasonic detection system, showing representative energy waves.

As shown in FIG. 2, the arrangement of the prior art also had a lens 100 to focus energy from a transducer 101 into the flow. While most of this energy would be sent into the flow, some would reflect back into the lens from an interface 102 between the lens 100 and the fluid as well as the interface 104 between the lens 100 and its sheath 106. This reflected energy would eventually reach and be detected by the transducer 101, and it could mask any reflection from a small particulate 108 in the flow.

Figure 3:
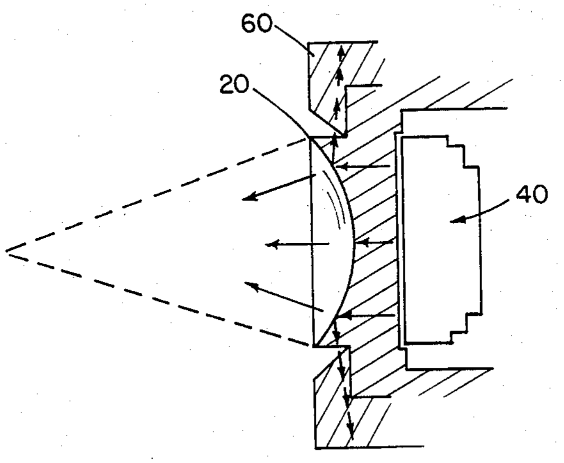
FIG. 3 is a cross-sectional view of an ultrasonic detection system of this invention, showing representative energy waves.

As shown in FIG. 3, the invention of the preferred embodiment generally prevents much of this energy from returning to the transducer 40. The sound impedance of the various media (the lens unit 20, the fluid and the ring 60) are closely matched, with the material of the damping ring 60 selected so that the speed of sound in it is less than in the lens material. As a result, the energy which strikes the lens wall 30 from inside the lens unit 20 tends to go out into the opening 64, which is filled with the fluid traveling in the pipe 74. This appears to be so regardless of the angle at which the energy strikes the wall 30. The energy then enters the damping ring 60, which tends to absorb it. Consequently, little energy is reflected back towards the transducer 40.

Other Embodiments

Figure 4:
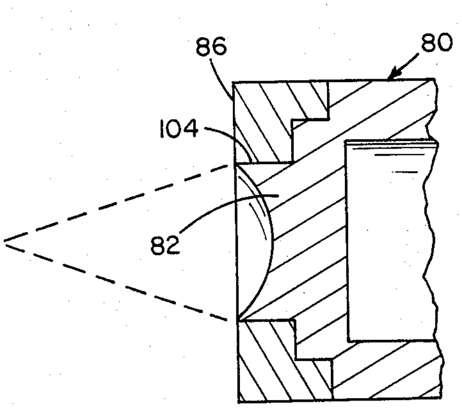
FIG. 4 is a cross-sectional view of another ultrasonic detection system of this invention.

A second embodiment of the invention is shown in FIG. 4. A lens unit 80 has a lens 82, as in the preferred embodiment. The lens 82 has an outer wall 84, and a damping ring 86 is disposed around and in contact with the wall 84. As before, the ring 86 and the lens unit 80 should be of materials which have approximately the same acoustic impedance, but the speed of sound should be less in the ring 86 than in the lens unit 80.

Other variations will occur to those skilled in the art.

What we claim is:

1. An ultrasonic detection apparatus comprising:

a transducer for generating ultrasonic signals, a lens unit having a lens, said lens having a sidewall, said lens being arranged to focus the ultrasonic signals from said transducer, and a damping ring, said damping ring being adjacent to said lens unit and angled away from said lens sidwall forming a small opening therebetween, wherein stray noise or energy in sid lens unit enters said damping ring rather than returning to said transducer.

2. The apparatus of claim 1 wherein the acoustic impedance of said damping ring is approximately the same as the acoustic impedance of said lens unit.

3. The apparatus of claim 1 wherein the speed of sound in said damping ring is less than the speed of sound in said lens unit.

4. The apparatus of claim 1 wherein said damping ring is made of Teflon ®.

5. The apparatus of claim 4 wherein said lens unit is made of polymethyl methacrylate.

* * * * *